United States Patent [19]
Batz

[11] 3,717,869
[45] Feb. 20, 1973

[54] ANALOG TO DIGITAL CONVERTER HAVING AN ELECTROSTATIC ENCODER

[75] Inventor: James E. Batz, Northbrook, Ill.

[73] Assignee: Northern Illinois Gas Company, Aurora, Ill.

[22] Filed: Nov. 24, 1970

[21] Appl. No.: 92,445

[52] U.S. Cl. ................................340/347 P, 323/93
[51] Int. Cl. ................................................G08c 9/02
[58] Field of Search ...................................340/347 P

[56] References Cited

UNITED STATES PATENTS 3,198,937 8/1965 Wooster ...........................340/347 P
3,286,252 11/1966 Bose ................................340/347 P
3,238,523 3/1966 Masel ...............................340/347 P

*Primary Examiner*—Maynard R. Wilbur
*Assistant Examiner*—Robert F. Gnuse
*Attorney*—Johnson, Dienner, Emrich, Verbeck & Wagner

[57] ABSTRACT

An analog-to-digital converter including a encoder for electrostatically coupling signals of different phases from a signal generator to sense elements selectively as a function of the angular position of a shaft, and phase detection circuits connected to the sense elements for determining the phase of the signals coupled to each sense element to provide a binary coded word representing the angular position of the shaft.

17 Claims, 19 Drawing Figures

INVENTOR
JAMES E. BATZ
BY [signature]
ATTYS.

PATENTED FEB 20 1973

3,717,869

TIMING DIAGRAM FOR FIG. 1

INVENTOR
JAMES E. BATZ

BY Johnson, Dienner, Emrich, Verbeck & Wagner

ATTYS.

PATENTED FEB 20 1973 3,717,869

INVENTOR
JAMES E. BATZ

BY

ATTYS

INVENTOR
JAMES E. BATZ

BY [signature]

ATTYS

ANALOG TO DIGITAL CONVERTER HAVING AN ELECTROSTATIC ENCODER

BACKGROUND OF THE INVENTION

1. Field of the Invention

This invention relates to analog-to-digital converters, and more particularly to a converter including a non-contacting encoder for providing binary output signals coded in an unambiguous code representing angular positions of a shaft.

2. Description of the Prior Art

Analog-to-digital converters for translating the angular position of a shaft into binary coded signals generally comprise a code disc carried by the shaft, and pickup means cooperative with the code disc to provide output signals which indicate shaft position.

In one type of converter having an electromechanical encoder, the code disc has a plurality of concentric zones or tracks of conductive material which are selectively engaged by pickup brushes as the disc rotates with the shaft to complete circuit paths between a source and a detecting circuit in such a way that the detecting circuit provides a unique set of output signals for each shaft position that is indicated. However, because in contact type encoders the brushes must contact the code disc, friction losses are introduced into the converter system, and such losses affect the reliability of the measurements obtained using such encoders.

A second type of converter employs a non-contacting type encoder including a code disc mounted for rotation by the shaft and positioned between a light source and a plurality of light detectors. As the shaft rotates the code disc, light is passed to certain ones of the light detectors in accordance with a code represented by a pattern of clear and opaque areas on the disc. Although optical encoders avoid the contact problems associated with electromechanical encoders, optical encoders require a light source and light detectors to perform the function of the contact means of the electromechanical encoder. Moreover, in optical encoders, means must be provided for distinguishing between detected light from the light source and ambient light. Consequently, optical encoders are generally more expensive than electromechanical type encoders.

A further consideration of prior art encoders of both the contacting and the non-contacting types is that to obtain unambiguous coding, the code discs used have complex code patterns including a plurality of code tracks, each comprised of a number of segments or zones of conductive and non-conductive material (or clear and opaque areas). The multi-track code discs require sophisticated signal detection circuitry to detect the individual output signals provided for each track of the code disc and to then combine the outputs to realize a set of binary output signals coded to represent shaft positions.

SUMMARY OF THE INVENTION

The present invention provides an analog-to-digital converter including a non-contacting type encoder which electrostatically couples signals from a signal generator to signal detecting circuits as a function shaft position to permit the generation of binary coded words representing the angular position of the shaft.

The encoder comprises an energizing member mounted for rotation by the shaft, a coupling member for coupling signals of different phases from the signal generator to the shaft mounted energizing member, and a code member including a plurality of sense elements for receiving signals coupled to the code member from the energizing member. The energizing member has a pair of stimulus elements which effect selective coupling of the signals to the sense elements of the code device such that as the energizing member rotates with the shaft, signals of one phase are coupled to certain sense elements and signals of the other phase are coupled to other sense elements.

The sense elements are individually connected to inputs of the signal detecting circuits which determine the phase of the signal coupled to each element by comparing the signals coupled to each element with a reference signal. The detecting circuit provide a series of logic 1 or logic 0 level outputs which correspond to the detection of signals of one phase or the other, respectively. The series of logic 1 and logic 0 outputs provided by the signal detecting circuits form logic words which represent the angular position of the shaft.

In accordance with one embodiment of the invention, the code member has six sense elements arranged in a single track permitting twenty different binary words to be provided. Each binary word is comprised of six bits representing the phases of the signals being coupled to the six sense elements, and the twenty words provide an unambiguous code which represents ten digit positions of the shaft to indicate the decimal numbers 0–9, and ten interdigital positions which permit round off.

Thus, in the encoder of the present invention, only six sense elements are required to provide unambiguous coding for twenty positions of the shaft. Consequently, the code provided by the encoder is simpler than that of previous converters, and the set of signals provided by the encoder are more easily detected and translated into logic levels coded by the signal detecting circuits of the converter to represent shaft position. Since only one track of sense elements is required, the sense elements can be larger for a given size of a code element. Moreover, because of the simplified code pattern, the code device is less expensive to manufacture than code devices previously proposed.

In one embodiment, the signals provided by the encoder for each sense element are amplified one at a time and limited in amplitude, and the resulting signal is fed to a flip flop which is clocked at a predetermined rate such that signals of one phase will cause the flip flop to be set with each clock pulse while signals of the opposite phase will be ineffective to set the flip flop. The flip flop will thus provide logic 1 or logic 0 levels at the output which represent signals of one phase or the other, respectively. The series of outputs provided will comprise a logic word which represents the position of the shaft.

Since the operation of the converter is based on the detection of phase of the signals rather than signal amplitudes, the sensing circuits required for translating the signals provided by the encoder into binary levels are simplified.

DESCRIPTION OF THE PREFERRED EMBODIMENT

Figure 1:
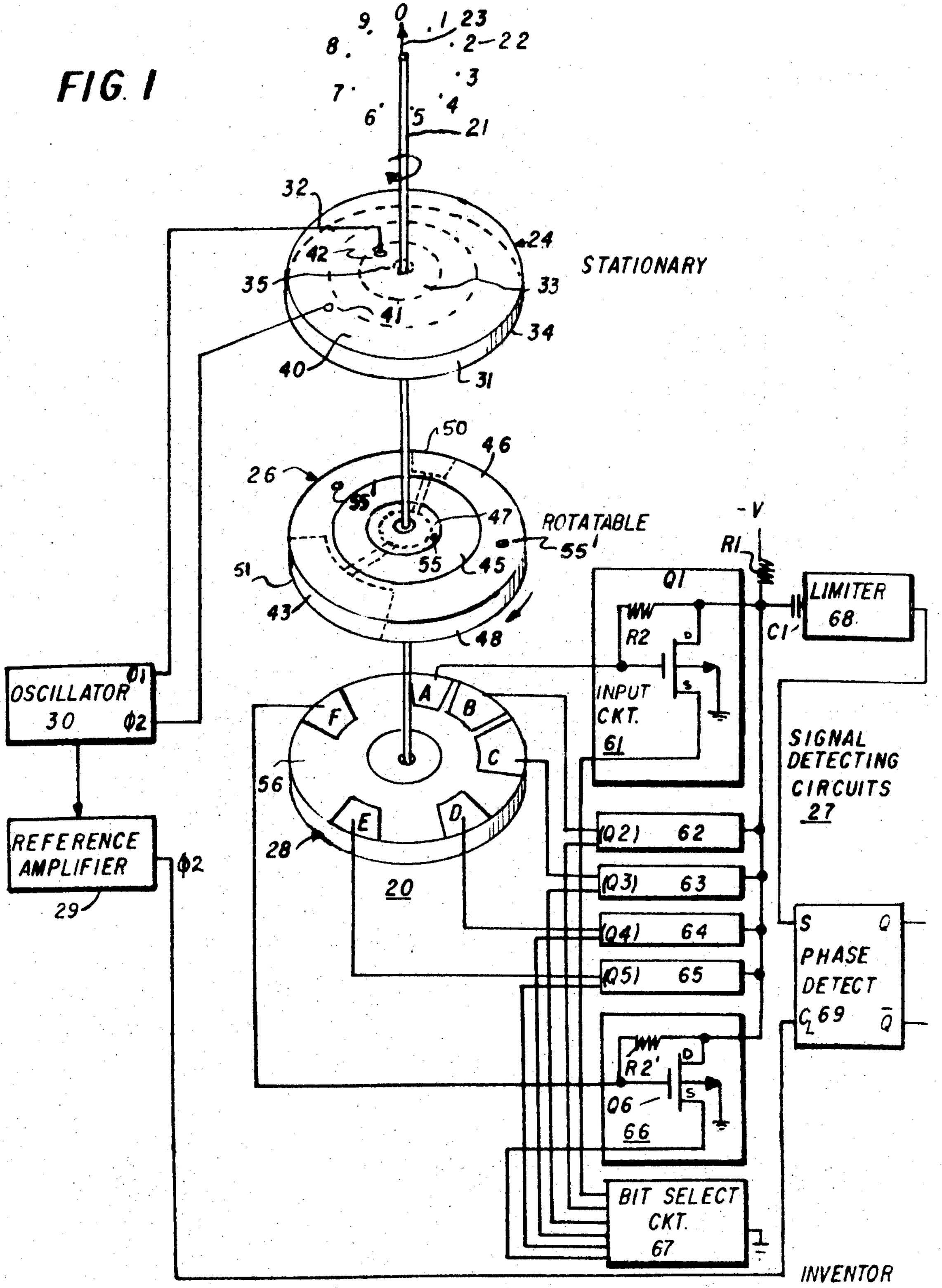
FIG. 1 is a schematic representation of an analog-to-digital converter provided by the present invention.

A schematic representation of the analog-to-digital converter provided by the present invention is shown in FIG. 1. The converter employs a non-contacting encoder assembly 20 which is operative with a signal generator 30 to convert the analog position of a shaft 21 into binary, coded signals. By way of example, the shaft 21 may be associated with a register of a utility meter having a dial 22 for indicating measured amounts of a commodity used. In one such application, the dial register has ten digits 0–9, circumferentially spaced about the dial 22 and a pointer 23 carried by the shaft 21 provides a visual indication of the angular position of the shaft 21 to thereby indicate a measured quantity.

The encoder assembly 20 which converts the position of shaft 21 into binary coded signals comprises an input member 24, an energizing member or disc 26 and a code member 28 coaxially aligned on the shaft 21. The input member 24 and the code member 28 are mounted in fixed or stationary positions within the register and the energizing member 26 is mounted on the shaft for rotation therewith. As can be seen in FIG. 1, the energizing member 26 is positioned between the input member 24 and the code member 28 and serves to permit selective coupling through capacitor action, of signals from a signal generator or oscillator 30 to sensing elements A–F of the code member 28 as a function of shaft position. While in FIG. 1 the spacing between the input member 24 and the energizing member 26 and between the energizing member 26 and the code member 28 is indicated as being large, it is pointed out that this is done for purposes of illustration only and that in application the spacing between adjacent members would be the minimum spacing required to permit electrostatic coupling between conductive elements on adjacent surfaces of the members 24, 26 and 28.

The input member 24 comprises a planar substrate 31 of insulating material having a central aperture 35 through which passes the shaft 21 which carries the pointer 23. The input member 24 has a pair of concentric rings 32 and 33 of electrically conductive material (indicated by the dotted lines in FIG. 1) disposed on substrate 31 on a surface 34 which is adjacent the energizing member 26.

Figures 2, 3A, 3B, 3C, 3D, 3E, 3F, 3G, 3H, 3I, 3J, 4:
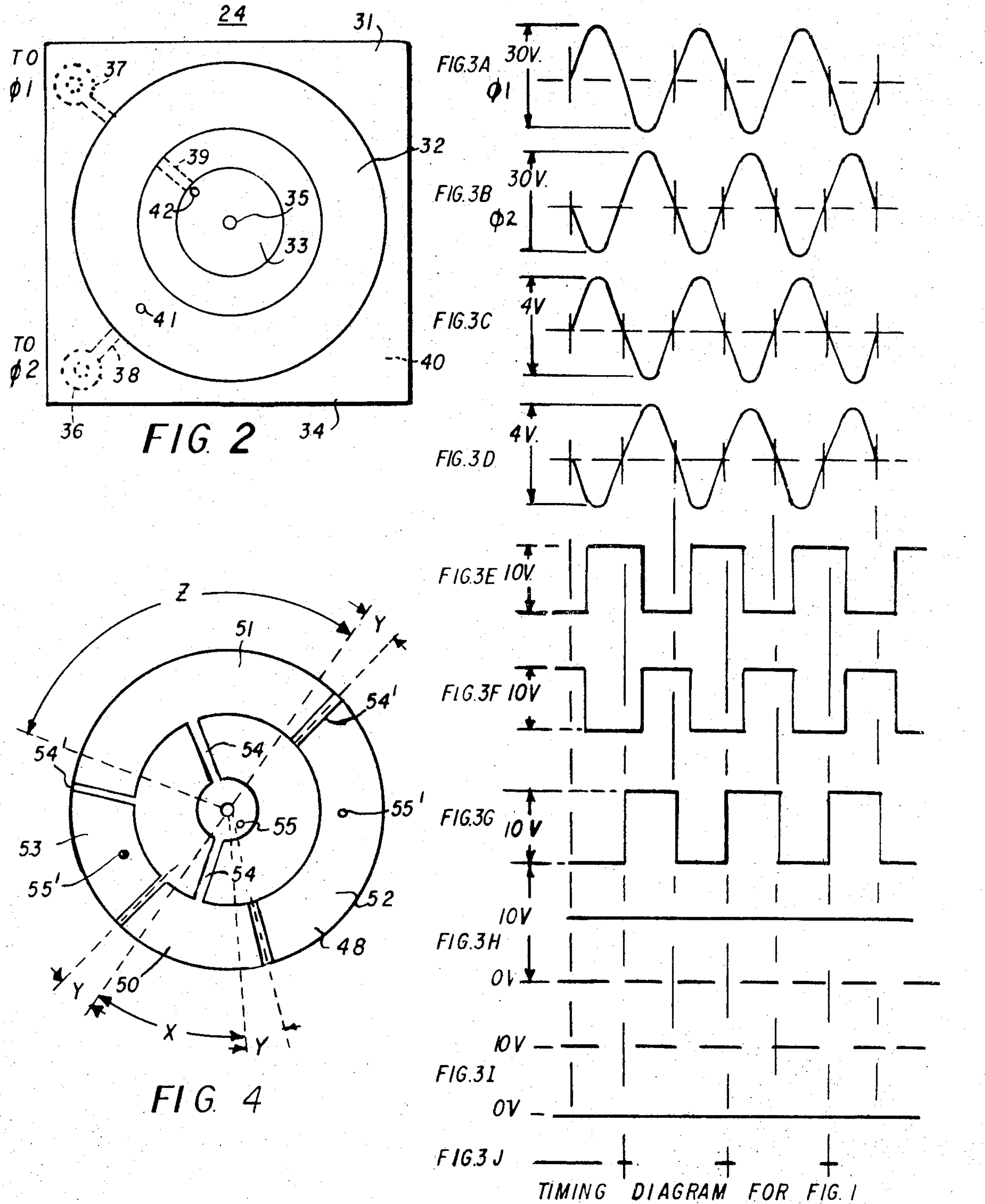
FIG. 2 is a plan view of the input signal coupling member of the encoder of the converter shown in FIG. 1.
FIGS. 3*a*–3*J* show the waveforms and timing relationships for signals at the outputs of the circuits of FIG. 1.
FIG. 4 is a plan view of one surface of the energizing member of the encoder showing the configuration of the stimulus elements.

Referring to FIG. 2 which is view of the bottom surface of member 24, in one embodiment for an input member 24, the conductive rings 32 and 33 are formed on the substrate 31 using printed circuit techniques known in the art, and are extended to terminals 36 and 37, respectively, on the top surface 40 via printed conductors 38 and 39 which are deposited on surface 40 of the substrate 31. The printed conductors 38 and 39 are connected to the conductive rings 32 and 33 at points 41 and 42 (FIG. 1) using known printed circuit interconnection means such as plated through holes, conductive paste, solder, etc..

The outer conductive ring 32 is connected via terminal 36 to one output $\phi 2$ of an oscillator 30 and the inner conductive ring 33 is connected via terminal 37 to a second output $\phi 1$ of the oscillator. The connections between the oscillator outputs $\phi 1$ and $\phi 2$ and the conductive rings 33 and 32 are preferably made on the surface 40 to eliminate crossovers of conductors on the bottom surface 34 such that two substantially uniform electric fields can be established. The area of the conductive ring 32 is approximately equal to the area of conductive ring 33.

The oscillator 30 (FIG. 1) provides sinusoidal output signals $\phi 1$ of a positive phase at output $\phi 1$, and signals $\phi 2$ of a negative phase $\phi 2$ at output $\phi 2$. The output signals $\phi 1$ may be, for example, 30 volts peak-to-peak. The signals may be of a frequency in the range of 3$KH_z$ to 100 $KH_z$, the lower limit of the frequency range being a function of the size of sense elements A–F of code member 28, and the upper limit being a function of the response characteristics of the signal detecting circuits 27. The output signals $\phi 2$ are of the same amplitude and frequency; however, signals $\phi 2$ are of a different phase.

In the illustrated embodiment, the signals $\phi 2$ are 180° out of phase with signals $\phi 1$. The waveform for signals provided at output $\phi 1$ are shown in FIG. 3A and the waveform for signals provided at $\phi 2$ are shown in FIG. 3B. An output of the oscillator 30 is also extended to the input of a reference amplifier 29 (FIG. 1) which provides a signal of phase $\phi 2$ for clocking a flip flop 69 in a signal detection circuit 27 of the converter. The oscillator circuit is developed around a commercially available oscillator circuit of type CD 4001D manufactured by RCA. This QUAD 2-input gate allows the oscillator circuit and reference amplifier to be constructed using a single IC package.

Referring to FIG. 1, the $\phi 1$,$\phi 2$ signals from the oscillator 30 which appear respectively on the concentric rings 33 and 32 of input member 24 are coupled via energizing member 26 to the code member 28. As there shown, energizing member 26 comprises a disc shaped planar substrate 43 which is attached to the shaft 21 for rotation with the shaft 21. The upper surface 45 of the energizing member includes a pattern concentric of rings 46, 47 of electrically conductive material which are substantially the same size and have the same areas as the rings 32, 33 respectively located on surface 34 of the input member 24 and which are located in displaced superposed relation therewith. Accordingly, the input signals $\phi 1$ and $\phi 2$ extended from the oscillator 30 to elements 33 and 32, respectively, of the input element 24 will be continuously coupled to elements 47 and 46 of the energizing member 26 even while the energizing member 26 is rotating, and the electric fields by such coupling will be constant.

With the described relative positioning of members 24 and 26, the two annular rings 46 and 47 on surface 45 of disc 26 are electrically coupled to the conductive rings 32 and 33 on the lower surface 34 of the input member 24 such that the outer ring 46 conducts signals of the negative phase $\phi 2$ and the inner ring 47 conducts signals of the positive phase $\phi 1$. The input signals will be continuously applied to the energizing member 26 regardless of the angular position of the member 26, and there will be substantially no variation in the signals of phases $\phi 1$ and $\phi 2$ which are coupled from the input member 24 to the energizing disc 26.

The lower surface 48 of the energizing disc, shown in plan view in FIG. 4, is comprised of two pair of stimulus elements 50, 51 and 52, 53 of an electrically conductive material forming four arcuate segments which are disposed in spaced relation along the circumference of the disc 26 and insulated from one another by areas of insulating material 54'. The area of segment 50 is approximately the area of segment 53, and the area of segment 51 is approximately equal to the area of segment 52.

The inner ring 47 located on the upper surface 45 of disc 26 is electrically connected at point 55 to conductor 54 and to the stimulus elements 50 and 51 of the disc 26 such that the positive phase signals $\phi 1$ are extended to the elements 50 and 51 located on the lower surface 48 at the disc 26. Likewise, the outer ring 48 located on the upper surface 45 of disc 26 is electrically connected at points 55' to the elements 52 and 53 located on the lower surface 48 of the energizing disc 26 and the signals of phase $\phi 2$ will be extended to these conductive surfaces 52, 53. Such interconnections may be made using printed circuit techniques known in the art.

Figures 9, 10:
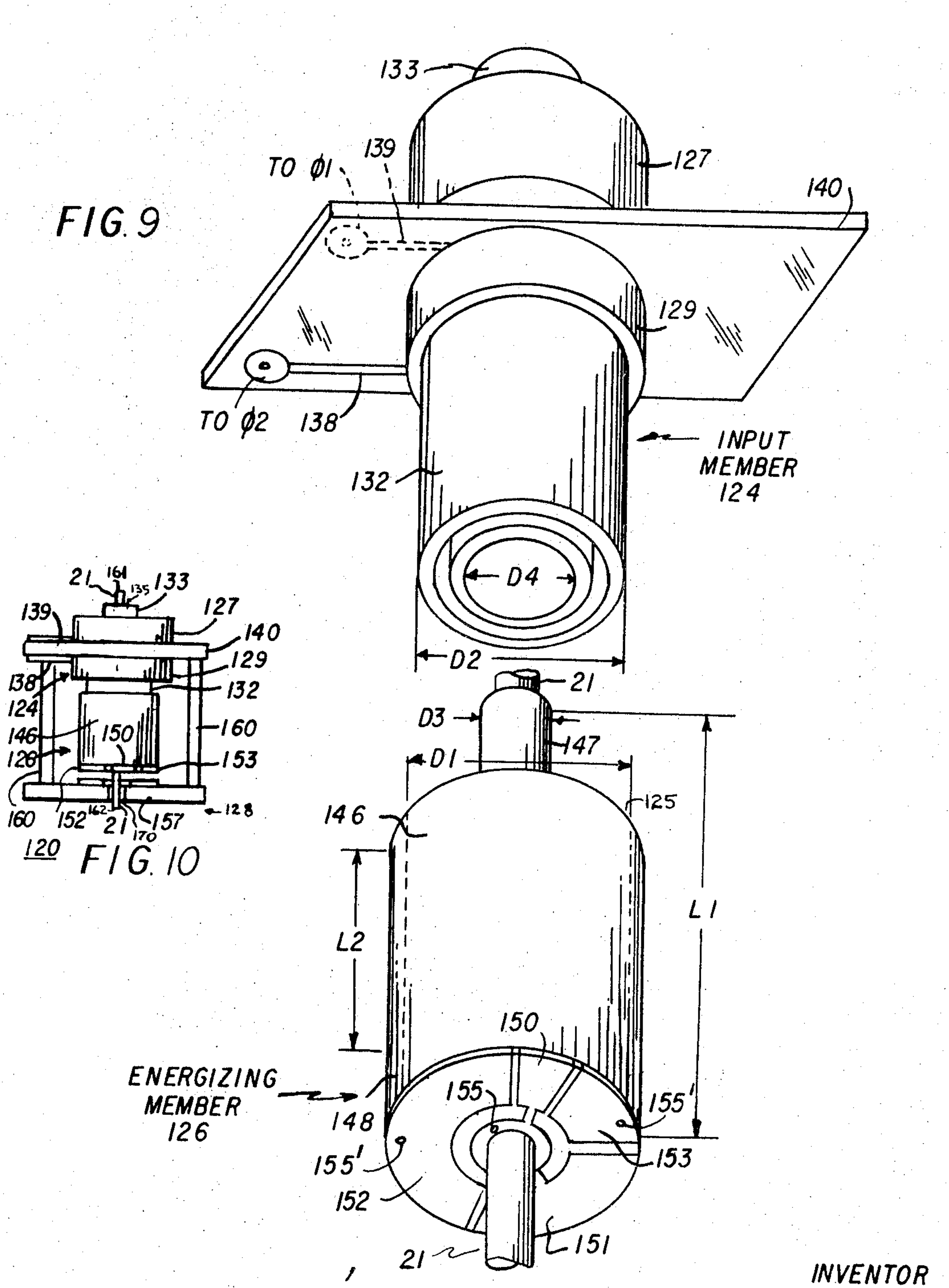
FIG. 9 is a partially exploded, isometric view of a further embodiment of an input member and an energizing member.
FIG. 10 is a side view of an assembled encoder having the input member and energizing member shown in FIG. 9.

Referring to FIGS. 9 and 10, in a second embodiment for an encoder 120, coupling of signals of phases $\phi 1$ and $\phi 2$ between an input member 124 and an energizing member 126 is provided by cylindrically-shaped coupling elements 132, 133, 146 and 147.

The input member 124 which is mounted stationary comprises a pair of hollow concentric cylinders 132, 133 of an electrically conductive material. The cylinders are spaced apart from one another in insulated relationship. Alternatively, the signal distributing elements(132, 133) of the input member 124 may comprise a single cylinder of insulating material having conductive material disposed on inner and outer surfaces.

The cylinders 132 and 133 each have an integrally formed mounting collar 127 and 129, respectively, which mount the cylinders 132 and 133 on a support member 140 and assure that the axis of each cylinder 132, 133 is perpendicular to the plane of the support member 140. Thus, when the input member 124 is mounted relative to the energizing member 126, which is mounted for rotation with the shaft 21, the cylinders 132 and 133 will be coaxially aligned with the shaft 21 which passes through a central aperture 135 of the cylinder 133.

The mounting collar portions 127 and 129 of cylinders 133 and 132, respectively, are extended via conductors 139 and 138 (which may be printed on the support member 140) to outputs $\phi 1$ and $\phi 2$ such that cylinder 132 conducts signals of phase $\phi 2$ and cylinder 133 conducts signals of phase $\phi 1$.

The energizing member 126 includes a second pair of hollow concentric cylinders 146 and 147 of electrically conducting material. The cylinders 146 and 147 are electrically insulated from one another and spaced apart from one another to form channel 125 between the adjacent cylinder walls in which channel the cylinders 132 and 133 of the input member 126 are positioned in an overlying, interfitting relationship with cylinders 146, 147 when the encoder elements are assembled as shown in FIG. 10.

Signals coupled to the cylinders 146 and 147 from the cylinders 132 and 133 of the input member 124 are conducted to the electrically conductive stimulus elements 150–153 disposed on the lower surface 148 of energizing member 126 (FIG. 9). The stimulus elements 150–153 of energizing member 126 have the same configurations as the stimulus elements 50–53 of energizing member 26 (FIG. 4).

Stimulus elements 150 and 151 are connected at point 155 to the inner cylinder 147 of the energizing member 126, and stimulus elements 152 and 153 are connected at points 155' to the outer cylinder 146 of the energizing member 126.

The inner diameter D1 of cylinder 146 is greater than the outer diameter of D2 of cylinder 132, and the outer diameter D3 of cylinder 147 is less than the inner diameter D4 of cylinder 133 such that when the input member 124 and the energizing member 126 are assembled, cylinders 132 and 133 of the input member 124 are positioned within the channel 125 between the concentric cylinders 146 and 147 of the energizing member 126, but spaced apart from the cylinders 146, 147 to permit the energizing element to rotate freely relative to the cylinders 132, 133 which comprise the input member. When assembled a portion of the surface of cylinder 132 overlaps a portion of the adjacent surface of cylinder 146 and a portion of cylinder 133 overlaps a portion of the adjacent surface of cylinder 147.

Signal coupling occurs over areas defined by overlapping portions of the cylinders 132 and 146, and of cylinders 133 and 147. The diameter D3 of the inner cylinder 147 is approximately one-half the diameter D1 of the outer cylinder 146 and the length L1 of the portion of the inner cylinder 147 that is overlapped by cylinder 133 in twice the length L2 of the portion of the outer cylinder 146 that is overlapped by cylinder 132. Consequently, the areas defined by the overlapping portions of cylinders 132 and 146, and of cylinders 133 and 147 are approximately equal, and the amplitudes of the signals of phases $\phi 1$ and $\phi 2$ coupled to stimulus elements 150, 151 and 152, 153, respectively, will be approximately equal.

As shown in the view (FIG. 10) of the assembled encoder 120, the input member 124 and a code member 128 are mounted in a spaced overlying relationship, spaced apart from one another by members 160. The shaft mounted energizing member 126 is positioned between the input member 124 and the code member 128 for rotational movement relative to members 124 and 128. The coupling cylinders 132 and 133 of the input member 124 are positioned in the channel 125 (FIG. 9) provided by coupling cylinders 146 and 147 of the energizing member 126. One end 161 of the shaft 21 passes through a central aperture 135 of the input member cylinder 133. The amount by which input member coupling cylinders 132 and 133 overlap energizing member coupling cylinders 146 and 147, respectively, (for coupling members of given lengths) is a function of the spacing between the input member 124 and the code member 128 provided by the spacing elements 160 which limit the depth of insertion of cylinders 132 and 133 into the channel 125 formed between cylinders 146 and 147.

As can be seen in FIG. 10, the stimulus elements 150–153 of the energizing member 126 are positioned in overlying relationship with the sense elements A–F of the code member 128 and the other end 162 of the shaft 21 passes through a central aperture 170 of the code member 128 such that the stimulus elements 150–153 are coaxially aligned with the sense elements of A–F. The configuration of code member 128 is similar to that of code member 28 shown in FIG. 5.

Figure 5:
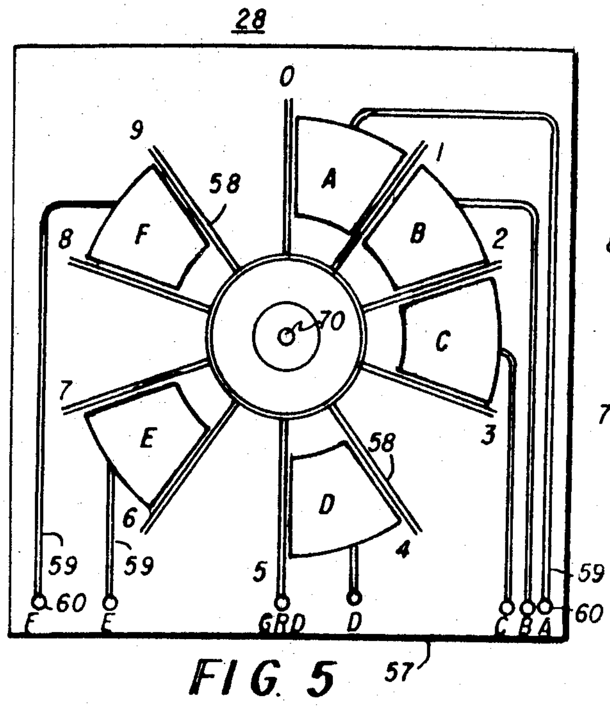
FIG. 5 is a plan view of one surface of the code member showing the configuration and layout of the sense elements.

A plan view of one embodiment for the code member 28 of the encoder is shown in FIG. 5. The code member 28 there shown includes a substrate 57 on which are disposed six substantially wedged-shaped segments of electrically conductive material which comprise sense elements A–F.

A plurality of ground conductors 58 disposed on the surface of substrate 57 and extending between adjacent segments provide electrical isolation between the adjacent segments and reduce the effects of stray signals which may be coupled to the encoder. The ground conductors 58 and the sense elements A-F are all extended via printed conductors 59 to a plurality of terminals 60 which permit connection to the input circuits 61–66 of signal detecting circuits 27 of the converter (FIG. 1). Shaft 21 of the encoder assembly 20 extends through aperture 70 in code member 28.

The sense elements are disposed on the surface 56 in a single annular track, the midpoints of the arcuate segments A–F being spaced apart from one another by increments which are, in the illustrated embodiment, multiples of 36°. Thus, for example, the midpoint of segment B is spaced apart from the midpoint of segment C by 36°, and the midpoint of segment C is spaced apart from the midpoint of segment D by 72°. The segments A–F are less than 36° in arcuate length to provide areas between adjacent segments in which the ground conductors 58 are disposed.

The sense elements are aligned in a displaced superposed relation with the stimulus elements 50–53 of the energizing member 26 (or energizing member 126). Such positioning permits signals present on stimulus elements 50–53 to be selectively coupled to the sense elements A–F. The use of a single track pattern for the sensing elements A–F permits larger sense elements to be used for a given size of an encoding member.

Referring to FIG. 1, the location of the sense elements A-F of the code member 28 on the surface 56 of substrate 57, and the configuration of the stimulus elements 50–53 of the energizing element 26 are such that as the energizing member 26 (or 126) rotates with the shaft 21, signals of the phase $\phi 1$ are selectively coupled to predetermined ones of the sense elements A–F, and signals of the opposite phase $\phi 2$ are coupled to the remaining sense elements. The phase of the signal coupled to each of the sense elements A–F is determined by the angular position of the energizing member 26 such that whenever stimulus 50 or 51 which carry $\phi 1$ signals overlie more than half of a sense element, a resulting signal of phase $\phi 1$ will be coupled to the element and whenever stimulus elements 52 or 53 which carry $\phi 2$ signals overlie more than half of a sense element, a resulting signal of phase $\phi 2$ will be coupled to the element.

The configurations of the stimulus elements 50–53 permit selective energization of the six sense elements A–F to provide sets of output signals representing the coding for 20 angular positions of the shaft 21, indicative of ten decimal positions of the dial and ten intermediate positions.

As shown in FIG. 4, the arcuate length of stimulus element 50 (and correspondingly stimulus element 53) is defined by the angle $X + 2Y$, and the arcuate length of stimulus element 51 (and correspondingly stimulus element 52) is defined by the angle $Z + 2Y$. In one embodiment, the value of X is 36°, the value of Y is approximately 9° and the value of Z is 108°. By establishing the angular lengths of stimulus elements 50 and 51 as approximately 1 ½ and 3 ½, respectively, times the arcuate length of the sense elements A–F (approximately 36°) the relationship of the stimulus elements 50–53 to the sense element A-F will change with each 18° of rotation of the shaft or 20 times for each complete revolution of the shaft to provide the 20 codes needed to permit unambiguous resolution of the shaft position into ten digit positions. With the values selected for angles X, Y and Z, the outputs corresponding to either full digit position or any intermediate position will be provided for 18° of rotation of the shaft. When the value of angle Y is less than 9°, the outputs representing intermediate positions will be provided for shorter time than will the outputs representing full digit positions.

The phase of the signals being coupled to each sense element A–F is determined through the use of the signal detection circuits 27 (FIG. 1) which include input circuits 61–66, a bit select or enable circuit 67, a limiter 68 and a phase detect flip flop 69.

The six sense elements A–F are read out one at a time in sequence as controlled by the bit select circuit 67, and the detecting circuits 27 provide a logic 1 output whenever a sense element being read out is conducting signals of phase $\phi 1$, and a logic 0 output whenever a sense element being read out is conducting signals of phase $\phi 2$. In reading out the six sense elements the signal detecting circuits 27, as controlled by the bit select circuit 67, provide a six bit binary word which represents a positional relationship between the sense elements A–F and the stimulus elements 50–53 and correspondingly, an indication of the angular position of shaft 21.

CODING FOR DIGIT POSITIONS

In the illustrated R2 the invention 20, six bit binary words provide the coding necessary to allow resolution of ten decimal positions of the dial 22. The 20 code words are listed in Table I.

TABLE I

| Decimal Number | Possible States of Six Bit Code Segment | Number of Normal Transition States |
|---|---|---|
| | ABCDEF | |
| 0 | 100010 | |
| | 000010 | |
| | 000011 | |
| | 010010 | (3) |
| | 100011 | |
| | 110010 | |
| | 110011 | |
| 1 | 010011 | |
| | 000001 | |
| | 000011 | |
| | 001011 | (3) |
| | 010001 | |
| | 011001 | |
| | 011011 | |
| 2 | 001001 | |
| | 000001 | (1) |
| | 101001 | |
| 3 | 100001 | |
| | 100000 | |
| | 100100 | |
| | 100101 | (3) |
| | 110000 | |
| | 110001 | |
| | 110101 | |
| 4 | 110100 | |
| | 110000 | |
| | 111100 | (1) |
| 5 | 111000 | |
| | 011000 | |
| | 111010 | (1) |
| 6 | 011010 | |
| | 001000 | |
| | 001010 | |
| | 001110 | (3) |
| | 011000 | |
| | 011100 | |
| | 011110 | |
| 7 | 001100 | |
| | 000100 | |
| | 001101 | (1) |
| 8 | 000101 | |
| | 000100 | |
| | 000111 | (1) |
| 9 | 000110 | |
| | 000010 | |
| | 100110 | (1) |
| 0 | 100010 | |

As can be seen in Table I, each code word, such as the code word representing the coding for the zero position of the shaft comprises six bits with the bits one through six providing a binary coding (logic 1 or 0) for representing the phase of the signals being coupled to the six segments A–F, respectively. A logic 1 coding indicates the presence of a signal of phase $\phi 1$ on the segment, and a logic 0 coding indicates the presence of a signal of phase $\phi 2$ on the segment. Thus, in the code word (100010) for the zero position of the shaft, bits one and five which represent the coding for segments A and E, respectively, are logic 1 levels indicating the presence of signals of phase $\phi 1$ on segments A and E, and bits two through four and six which represent the coding for segments B–D and F, respectively, are logic 0 levels indicating the presence of signals of phase $\phi 2$ on segments B–D and F.

The code provides a different binary code word for each of ten digit positions 0–9 and ten interdigital positions ½, 1 ½, etc., which permit round off to one of the digit positions. An unambiguous code is obtained because for a given code word, there is only one region (or digit or interdigital location) of the dial represented by that code word.

In general, for a code word representing a given position, there is a difference in two or three bits between the code word for the given position and the code word representing the previous position.

For example, comparing the code words for position 2 and position 3

| | | |
|---|---|---|
| Position 2 | 001001 | |
| Position 2 ½ | 101001 | 000001 |
| (normal transition state) | (Impossible transition state) | |
| Position 3 | 100001 | |

only two bits are different.

However, by comparing, for example, the code word position 1, with the code word for position 0,

| | | |
|---|---|---|
| Position 0 | 100010 | |
| | (100011 | |
| | impossible | (000010 |
| Position ½ | (110010 | |
| | transition states | (010010 |
| (normal transition states | (110011 | (000011 |
| Position 1 | 010011 | |

it is seen that the first, second and sixth bits are different. A similar relationship is found by comparing the code words for positions 2, 4 and 7 with positions 1, 3 and 6.

In these four instances, three possible transition codes will exist between each position. Since the energizing disc stimulus elements are larger than the sense elements any zeroes will change to ones before any ones will change to zeros, thus eliminating the other three ambiguous transition states. However, these three normal transition states do not result in ambiguity because none of the codes produced are identical to those of another dial position.

The ten interdigital code words include logic 1 bits which, when compared with the last digital code word provided, permit round off to a digit position.

SIGNAL DETECTING CIRCUITS

Referring again to FIG. 1, each sense element A–F such as element A of the code member 28, is connected to the input of an input circuit 61–66, such as input circuit 61 for sense element A. A separate signal detecting circuit is provided for each segment A–F. Each of the input circuits 61–66, such as circuit 61, includes an enhancement mode field-effect transistor, such as transistor Q1 for circuit 61, having a gate lead connected to the segment A and a drain lead connected through a resistor R1 to a voltage source −V which may be 10 volts. One FET device suitable for this application is the Fairchild type 3701.

The source lead of the FET is connected to an output of a bit select or enabling circuit 67 which provides an enabling signal for the FET devices which comprise the input circuits 61–66, permitting the phases of the signals being coupled to elements A–F to be determined one at a time, there-by providing serial readout of the signals to generate the bits which comprise the binary words indicative of the positions of the shaft 21.

A second resistor R2 is connected between the drain and the gate lead to provide forward bias for the FET device Q1, whenever the source lead is grounded.

Whenever the source lead is grounded, the FET device Q1 is biased in the active region and acts as a high gain buffer amplifier to isolate sense element A of the encoder 20 from the detecting circuitry 27. Input circuits 62–66 serve as buffer amplifiers for sense elements B–F, respectively.

The FET device sets its own bias level and the forward gain of the FET device is not critical since the convertor operates on the basis of the detection of phase rather than amplitude.

When the source lead is not grounded, the FET device Q1 provides an open circuit. Thus, in operation, the bit select circuit 67 provides an enable signal at ground level for each input circuit 61–66, one at a time, to permit serial readout of the encoder information as provided by elements A–F.

The output of the input circuit 61 is coupled through a capacitor C1 to the input of the limiter 68. The limiter is comprised of a plurality of squaring amplifiers cascaded to shape the detected signals to provide squarewave signals of positive polarity (FIG. 3E) or negative polarity (FIG. 3F), depending on whether the signal detected is of phase $\phi 1$ or phase $\phi 2$. The limiter was constructed around a commercially available type CD 4007 D manufactured by RCA.

The output of the limiter 68 is connected to the set input S of a phase comparison or detect flip flop 69. A commercially available flip flop is the type CD 4003 D manufactured by RCA.

The flip flop is clocked by a reference squarewave signal of phase $\phi 2$ (FIG. 3G) provided at the output of the reference amplifier 29 and extended to the clock pulse input CL of the flip flop 69. The reference amplifier provides a reference signal having risetime on the order of 0.5 microseconds, assuring a sharp transition of the positive going oscillator output $\phi 2$.

As will be shown in an illustration of the operation of the converter when an element such as element A is being interrogated while the signals coupled to the sense element are substantially of phase $\phi 1$, the flip flop 69 will be set by the next clock pulse provided at the clock pulse input CL from the output of reference amplifier 29, providing a logic 1 signal level (FIG. 3H). If, on the other hand, signals being coupled to the sense element A are substantially of phase $\phi 2$ when the sense element A is interrogated, the flip flop 69 will not be set by the clock pulse, and the output of the flip flop 69 will remain at a logic 0 level (FIG. 3 I).

OPERATION OF THE ENCODER

Signals of phases $\phi 1$ and $\phi 2$ are selectively coupled from the oscillator 30 via the input member 24 (or 124) and the energizing member 26 (or 126) to the sense elements A–F of the code member 28 (or 128). The phase of the signals ($\phi 1$ or $\phi 2$) that are coupled to the sense elements A–F of the code member 28 are determined by the analog position of the energizing element 26 (and the conductive stimulus elements 50–53 carried thereon) relative to the conductive sense elements A–F disposed on the code member 28. The position of the energizing member is determined by the position of shaft 21.

For example, when the shaft 21 is in the position shown in FIG. 1 with pointer 23 indicating a reading of zero on the dial 22, the angular position of the energizing member 26 is such that stimulus element 50 overlies segment A, stimulus element 51 overlies segment E, stimulus element 52 overlies elements B–D, and stimulus element 53 overlies element F.

Figure 6:
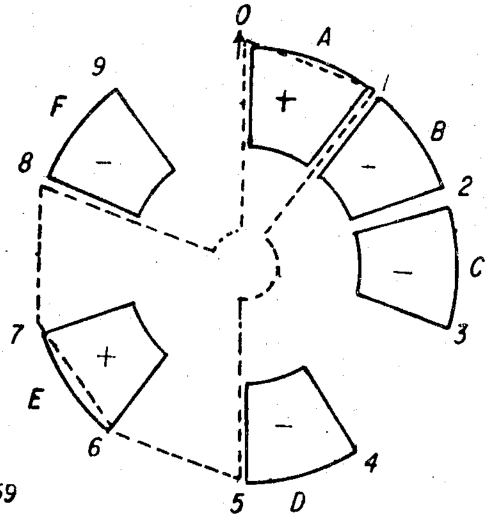
FIGS. 6–8 are schematic representations of the sense element and the shaped electric fields created by the energizing element for use illustrating the operation of the encoder.

Accordingly, signals of phase $\phi 1$ extended from the oscillator 30 to the inner conductive ring 33 of input member 24 are coupled via conductive element 47 and stimulus elements 50 and 51 energizing member 26 to sense elements A and E of the code member 28. An electric field established between energizing member 26 and code member 28 by the signals of phase $\phi 1$ terminates on the stimulus elements 50 and 51 and sense elements A and E. However, for purposes of illustration, the electric field is shown in FIG. 6 to have boundaries indicated by the dotted lines. As can be seen in FIG. 6, the electric field created by signals of phase $\phi 1$ is shown to extend over the portion of the code member including sense elements A and E.

Similarly, signals of phase $\phi 2$ extended from the oscillator 30 to the outer conductive ring 32 of input member 24 are coupled via conductive member 46 and stimulus elements 52 and 53 of the energizing member 26 to sense elements B–D and F of the code member 28 establishing two other electric fields shaped by the stimulus members 52 and 53, and the sense elements $\phi 2$ between the energizing member 26 and the code member 28 extend over the portions of the surface of the code member 28 that lie outside the boundaries of the electric field provided by the signals of phase $\phi 1$. Thus, the other electric fields extend over the area of the code member which include sense elements B–D and F.

The boundary of the electric field created by the signals of the positive phase $\phi 1$ established between stimulus elements 50 and 51 and sense elements A and E is indicated by the dotted lines in FIG. 6 and segments A and E within the field are marked with plus signs. The electric fields created be segments of the negative phase $\phi 2$ will be established between stimulus elements 52 and 53 and segments B–D and F; the sense elements B–D and F are marked with minus signs.

Referring to FIG. 1, the resultant signal at the gate of the FET Q1 due to the $\phi 1$ signals coupled to sense element A will be a voltage of approximately from 4 volts peak-to-peak (FIG. 3C) of the same phase as signals $\phi 1$ from the oscillator 30.

When the source lead of FET Q1 is grounded by the bit select circuit output, FET Q1 will amplify the input signal, and the resultant signal will be coupled over capacitor C1 to the limiter 68 providing a squarewave output of approximately 10 volts (FIG. 3E) at the limiter output which signal is passed to the set input S of the phase detect flip flop 69 (FIG. 3G).

When the reference signal provided by the reference amplifier 29 is applied to the clock input C1 of the flip flop, the positive going edge of the reference signal will set the flip flop 69 providing a logic 1 level (FIG. 3H) at the output of the flip flop 69.

In the case of the interrogation of sense elements B–D and F, such as element B, to which are coupled signals of the negative phase $\phi 2$, the waveform at the input of the signal detecting circuit 62 associated with element B will be as shown in FIG. 3D; the signal at the output of the limiter 68 will be that shown in FIG. 3F; and the output of the flip flop 69 will be a logic 0 level as shown in FIG. 3I).

The output of the phase detect flip flop 69 is stored in suitable pulse register circuits (not shown) such that after the six sense elements A–F have been interrogated, the register will store the six bit binary word 100010 as given in Table I which represents the coding for the position of the shaft 21 when the pointer indicates a reading of zero.

It is pointed out that the limiter circuit 68 provides a delay in the signal at the limiter output as can be seen by comparing the waveforms of FIGS. 3C and 3E or FIGS. 3D and 3F. Consequently, the sampling time which is determined by the leading edge of the reference signal (FIG. 3J) will occur at times other than when the limiter output signal is going from zero to 10 volts or vice versa.

Sense elements B–F are interrogated in a manner similar to that described above with reference to segment A when the source lead of the FET device associated with signal detecting circuits 62–66 is grounded by an enable signal provided by the bit select circuit 67 permitting the signals of the positive phase $\phi 1$ for segment E and the signals of the negative phase $\phi 2$ for segments B-D and F to be coupled to the limiter 68 for controlling the flip flop to provide logic 1 or logic 0 levels in accordance with the input to the flip flop 69.

As the shaft 21 rotates responsive to measurement, the energizing member 26 will be rotated with the shaft and as the stimulus member 50, which carries signals of phase $\phi 1$, begins to overlie sense element B, and the stimulus member 51 begins to overlie segment F, the signals of phase $\phi 1$ will be coupled to sense elements B and F (as well as to sense elements A and E) and will begin to nullify the signals of phase $\phi 2$ being coupled to the elements B and F by the stimulus elements 52 and 53.

Although the phase of the net signal present on elements B and F will be of phase $\phi 2$ as long as stimulus elements 52 and 53 overlie more than 50 per cent of elements B and F, the signal (FIG. 3D) provided at the inputs of associated input circuits 62 and 66 will be decreased in amplitude. However, the output (FIG. 3F) of the limiter will be of phase $\phi 2$. Accordingly, the binary coded output signals provided by the converter circuit 27 will remain the same as described in the foregoing. When the shaft 21 has moved the pointer 23 to a position which is approaching midway between the zero and the one on the dial 22, the energizing member will have been rotated to a position such that stimulus element 50 overlies approximately 50 per cent of sense element B, and stimulus element 51 overlies approximately 50 per cent of sense element F.

At such time, the signals of phase $\phi 1$ coupled to sense elements B and F by stimulus elements 50 and 51 will nullify the signals of phase $\phi 2$ coupled to elements B and F by stimulus elements 52 and 53 and the input signals provided at input circuits 62 and 66 associated with elements B and F, respectively, will be zero.

However, since input circuits 61–66 comprise high gain amplifiers, noise in these amplifier circuits will provide an output signal capable of controlling the limiter 68 to provide a signal representing either a phase $\phi 2$ or phase $\phi 1$ signal. Since the reading is in a transition region in which a reversal in the phase of the detected signal is occurring, if the output due to the noise level represents phase $\phi 2$ it will appear that signals of phase $\phi 2$ are predominant and that the transition has not occurred. On the other hand, if the output due to the noise level represents phase $\phi 1$, it will appear that signals of phase $\phi 1$ are predominant and that the transition has occurred. The coding provided will remain unchanged until the latter condition occurs.

Figure 7:
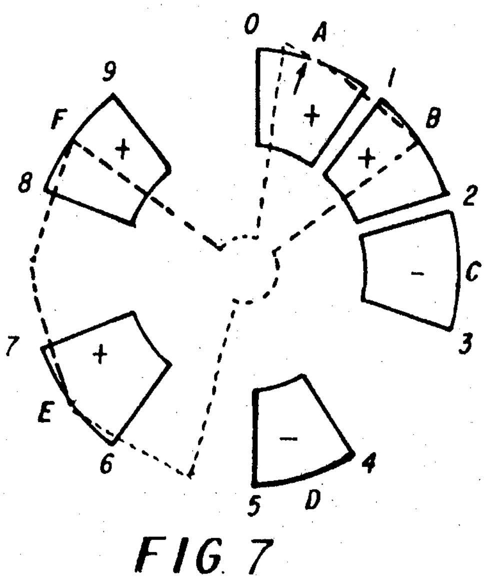
Figure 8:
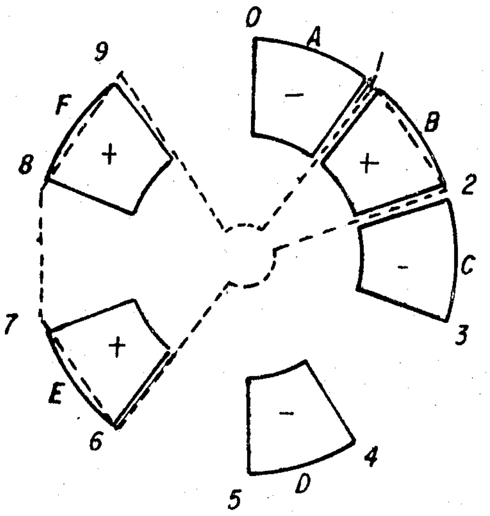

As the shaft continues to rotate, stimulus element 50 and 51 will overlie more than 50 per cent of sense elements B and F, respectively. Accordingly, the electric field due to the signals of the positive phase $\phi 1$ coupled to the energizing element will be as shown by the dotted lines in FIG. 7, and the signals coupled to sense elements A, B, E, and F will be predominantly of the positive phase. Signals of the negative phase $\phi 2$ will be coupled to the remaining sense elements C and D.

Consequently, when the six sense elements A–F are read out, one at at a time, the logic levels provided at the output of the phase comparison flip flop 69 will be 110011, which as shown in Table I, represent the binary word for the digital position ½.

As the shaft 21 continues to rotate to move the pointer to the digit 2 responsive to measurement, the energizing member 26 will be moved to a position in which stimulus element 50 overlies only sense element B and stimulus element 51 overlies sense elements E and F. Consequently, signals of the phase $\phi 1$ will be coupled to sense elements B, E and F. Signals of phase $\phi 2$ will be coupled to elements A, C and D. Read out of the sense elements A–F will provide the binary word 001011 shown in Table I to represent the coding for the digit two.

The coding for the remaining digits 3—9 and the coding for the interdigital positions is given in Table I. By considering the coding provided in the TAble I for various positions of the shaft in view of the foregoing it is apparent how the energizing member 26 will be effective to selectively couple the signals of the phases $\phi 1$ and $\phi 2$ to the sense elements A-F as the shaft rotates, so as to provide the coding for the digits zero-nine as given in Table I.

I claim:

1. In an analog-to-digital converter for providing a set of output signals coded to represent the angular position of a shaft, signal generating means for providing signals of first and second phases, encoder means including a code member having a plurality of discrete arcuate sense elements disposed on a surface thereof in a single annular track, each of said sense elements having the same arcuate lengths, and energizing means including an energizing member rotatable with said shaft relative to said code member including stimulus means having first and second stimulus elements disposed in a predetermined pattern on a surface of said energizing member which is adjacent said sense elements such that said first and second stimulus elements overlie different sets of said sense elements for each angular position of said shaft to be represented to selectively couple signals of said first phase to certain of said sense elements and signals of said second phase to certain others of said sense elements as a function of the angular position of said shaft, said first and second stimulus elements each having a first arcuate segment of a length which is approximately three and one-half times the arcuate length of a sense element and a second arcuate segment of a length which is approximately one and one-half times the arcuate length of a sense element whereby the signals coupled to said sense elements provide a different pattern of signals of said first and second phases over said sense elements for each 18° of rotation of said shaft.

2. An analog-to-digital converter as set forth in claim 1 in which said encoder means further includes means for providing signals of said first phase for coupling to said first stimulus element and means for providing signals of said second phase for coupling to said second stimulus element, whereby signals of said first phase are coupled to ones of the sense elements which the first stimulus element means overlies and signals of said second phase are coupled to the ones of the sense elements which the second stimulus element means overlies.

3. In an analog-to-digital converter for providing a set of output signals coded to represent the angular position of a shaft, signal generating means for providing signals of first and second phases, encoder means including a code member having a plurality of sense elements and an energizing member rotatable with said shaft relative to said code member including stimulus means for selectively coupling signals of said first phase to certain ones of said sense elements and signals of said second phase to certain other ones of said sense elements as a function of the angular position of said shaft to provide different patterns of signals for different positions to the shaft, and detecting means including input circuit means having a plurality of input circuits each connected to a different one of said sense elements, each of said input circuits being operable when enabled to provide a control signal of the same phase as the signal being coupled to an associated sense element, enable means for enabling said input circuits one at a time, and phase detecting means including reference means for providing a reference signal of one of said phases and phase comparison means including a flip flop having a set input connected to an output of said input circuit means and a clock input connected to an output of said reference means for comparing each of said control signals with said reference signal, said phase comparison means being operable to provide a first output signal whenever the phases of the compared signals are the same and a second output signal whenever the phases of the compared signals are different.

4. An analog-to-digital converter as set forth in claim 3 in which said phase comparison means further includes means connected between the output of said input circuit means and the set input of said flip flop for delaying each control signal relative to said reference signal.

5. In an analog-to-digital converter for providing a set of output signals coded to represent the angular position of a shaft, signal generating means for providing signals of first and second phases, encoder means including a code member having a plurality of sense elements disposed on said code member, and an energizing member mounted for rotation by said shaft and having stimulus means disposed on a surface thereof which is adjacent said sense elements for selectively coupling signals of said first phase to certain ones of said sense elements and signals of said second phase to certain other ones of said sense elements as a function of the angular position of said shaft, signal detecting means including a plurality of signal detecting circuits, each signal detecting circuit having an input individually connected to a different one of said sense elements, each of said signal detecting circuits being responsive to signals coupled to an associated sense element to provide an output signal representing the phase thereof , and phase detecting means including reference means for providing a reference signal of one of said phases, and a phase comparison flip flop having a first input connected to an output of said signal detecting means and a second input connected to an output of said reference means for comparing each output signal provided by said signal detecting means with said reference signal to provide a first binary output signal whenever the phases of the compared signals are the same and a second binary output signal whenever the phases of the compared signals are different to thereby generate a correspondingly different logic word for each pattern of signals extended to said signal detecting means.

6. An analog-to-digital converter as set forth in claim 5 in which said stimulus means comprises first and second stimulus elements of predetermined configurations whereby said first stimulus elements overlie said certain ones of said sense elements while said second stimulus elements overlie said certain other sense elements.

7. In an analog-to-digital converter for providing a set of binary output signals coded to represent the angular position of a shaft, signal generating means for providing signals of first and second phases, encoder means including a code member having a plurality of sense elements disposed in a single angular track, and an energizing member mounted for rotation by said shaft , said energizing member having first and second stimulus elements disposed on the surface thereof which is adjacent said sense elements, and first and second signal elements disposed on a further surface and connected to said first and second stimulus elements, respectfully, and input means including an input member having first and second input elements connected to outputs of said signal generating means for coupling signals of said first and second phases to said first and second signal elements, respectively, said first and second stimulus elements being disposed on said surface in a pattern in which said first stimulus element overlies certain ones of said sense elements while the second stimulus element overlies certain others of said sense elements to selectively couple signals of said first phase to said certain ones of said sense elements and signals of said second phase to said certain others of said sense elements as a function of the angular position of said shaft, and signal detecting means including a plurality of input circuits each connected to a different one of said sense elements, circuit select means for enabling said input circuits one at a time to provide a control signal of the same phase as the signal being coupled to the associated sense element, and phase detecting circuit means for providing in sequence a first binary output signal for each control signal of said first phase provided by said signal detecting means and a second binary output signal for each control signal of said second phase provided by said signal detecting means as said input circuits are enabled whereby the set of outputs provided by said phase detecting circuit means represents the angular position of said shaft.

8. An analog-to-digital converter as set forth in claim 7 in which said energizing member is rotatable by said shaft relative to said input member and in which the configurations of said input elements are substantially the same as the configurations of said signal elements to permit first and second electric fields to be established between said first and second input elements and said first and second signal elements, respectively, by said signals of said first and second phases, said electric fields remaining substantially unchanged as said energizing member is rotated by said shaft.

9. In an analog-to-digital converter for providing a set of binary output signals coded to represent the angular position of a shaft, signal generating means for providing signals of first and second phases, encoder means including a code member having a plurality of discrete sense elements disposed on a surface thereof in a single annular track, and an energizing member mounted for rotation by said shaft and having stimulus element means disposed on a surface thereof which is adjacent said sense elements for selectively coupling signals of said first phase to certain ones of said sense elements and signals of said second phase to certain others of said sense elements as a function of the angular position of said shaft, and detecting means including a plurality of signal detecting circuits, each of said signal detecting circuits including buffer amplifier means connected to a different one of said sense elements and being operable when enabled to provide a control signal of the same phase as the signal being coupled to an associated sense element, circuit select means for enabling said signal detecting circuits one at a time, and phase detecting means commonly connected to an output of each of said signal detecting circuits and isolated from said sense elements by said buffer amplifier means, said phase detecting circuit means being responsive to said control signals to provide a sequence of binary coded output signals, including a first binary output signal for each control signal of said first phase provided by said signal detecting circuits and a second binary output signal for each control signal of said second phase provided by said signal detecting circuits as said signal detecting circuits are enabled, whereby the binary coded sequence of output signals provided by said phase detecting circuit means represents the angular position of said shaft.

10. An analog-to-digital converter as set forth in claim 9 in which said phase detecting circuit means includes reference means for providing a reference signal of one of said phases, and phase comparison means for comparing each of said control signals with said reference signal and providing said first binary output signal when the phases of the signals being compared are the same, and said second binary output signal when the phases of the signals being compared are different.

11. In an analog-to-digital converter for providing a different set of output signals for each of a plurality of predetermined angular positions of a shaft, signal generating means for providing first and second signals over first and second outputs, and encoder means including a code member having a plurality of sense elements, an input member including a hollow cylinder means having inner and outer conductive surfaces connected to said first and second signal outputs, respectively, of said signal generating means for providing separate conducting paths for said first and second signals, energizing means having first and second stimulus element means and further coupling means including a pair of concentric cylinder members having opposing conductive surfaces spaced apart from one another defining a channel therebetween, one of said conductive surfaces being connected to said first stimulus means and the other conductive surface being connected to said second stimulus means, said input member coupling means and said energizing member coupling means being assembled in an interfitting overlapping relationship with said inner conductive surface overlapping a predetermined length of said one conductive surface but spaced apart from said one surface permitting said first signals to be coupled to said first stimulus means, and said outer conductive surface overlapping a different predetermined length of said other conductive surface but spaced apart from said other surface permitting said second signals to be coupled to said second stimulus means, said energizing member being mounted on said shaft for rotation thereby with said stimulus means being in overlying relationship with said code member to effect selective coupling of said signals to said sense elements as a function of the angular position of said shaft to thereby effect the generation of a different one of said sets of output signals over said sense elements for each predetermined angular position of said shaft.

12. An analog-to-digital converter as set forth in claim 11 in which the ratio of the diameters of said cylinder members is proportional to the inverse ratio of the lengths of respective conductive surfaces overlapped by the conductive surfaces of said hollow cylinder means.

13. In an analog to digital converter for providing a different set of output signals for each of a plurality of predetermined angular positions of a shaft, signal generating means for providing first and second signals over first and second outputs, and encoder means including a code member having a plurality of sense elements, an input member including a first planar element having a first pair of concentric rings of conductive material, the inner conductive ring being connected to said first output of said signal generating means and the outer one of said conductive rings being connected to said second output of said signal generating means, and an energizing member including a second planar element having first and second stimulus means disposed on a first surface thereof and a further pair of concentric rings of conductive material on a second surface thereof, the inner conductive ring being connected to said first stimulus means and the outer conductive ring being connected to said second stimulus means, said first planar element being mounted in a fixed position in overlying relationship with said energizing member with said first pair of conductive rings adjacent to but spaced apart from said second pair of conductive rings permitting said first signals to be coupled over said inner rings to said first stimulus means and said second signals to be coupled over said outer rings to said second stimulus means, said second planar element being mounted for rotation by said shaft relative to said code member in overlying relationship therewith to effect selective coupling of said signals to said sense elements as a function of the angular position of said shaft to thereby provide a different one of said sets of output signals over said sense elements for each predetermined angular position of said shaft.

14. An analog-to-digital converter as set forth in claim 13 wherein the areas of conductive material which comprise the inner and outer rings of said first and second pairs are equal.

15. In an analog-to-digital converter for providing a different logic word for each of a plurality of predetermined angular positions of a shaft, encoder means for providing a set of output signals of first and second phases in a pattern related to the angular position of said shaft, the pattern being different for each predetermined position for said shaft, output means including signal detecting means having a plurality of signal detecting circuits, each output signal of a given set being extended to a different one of said signal detecting circuits and each signal detecting circuit being operable when enabled to provide a control signal of the same phase as the output signal extended thereto, reference means for providing a reference signal of one of said phases, and a phase comparison flip flop having a first input connected to an output of said signal detecting means and a second input connected to an output of said reference means for comparing each control signal provided by said signal detecting means with said reference signal to provide a first logic level output signal whenever the phases of the compared signals are the same and a second logic level output signal whenever the phases of the compared signals are different to thereby generate a correspondingly different logic word for each pattern of signals extended to said signal detecting means.

16. An analog-to-digital converter as set forth in claim 15 in which said output means further includes circuit select means for enabling said signal detecting circuits one at a time to provide said control signals for said phase comparison flip flop.

17. In an analog-to-digital converter for providing a different set of output signals for each of a plurality of predetermined angular positions of a shaft, signal generating means for providing signals of first and second phases over first and second output circuits, and encoder means including a code member having a plurality of sense elements, an input member having first and second concentric rings of conductive material connected to said first and second output circuits, respectively, of said signal generating means, and an energizing member having third and fourth concentric rings of conductive material disposed in coupled relationship with said first and second conductive rings, respectively to receive said signals of said first and second phases therefrom, and first and second stimulus elements of predetermined configurations connected to said third and fourth conductive rings, respectively, and disposed in overlying relationshipwith said sense elements, said energizing member being mounted for rotation by said shaft relative to said code member to effect selective coupling of said signals of said first and second phases to said sense elements as a function of the angular position of said shaft to thereby provide a different set of output signals over said sense elements for each predetermined angular position of said shaft.

* * * * *